(12) United States Patent
Pispa

(10) Patent No.: US 7,881,045 B2
(45) Date of Patent: Feb. 1, 2011

(54) ENCLOSURE OF A POWER ELECTRONICS APPLIANCE

(75) Inventor: Matti Pispa, Isokyrö (FI)

(73) Assignee: Vacon Oyj, Vaasa (FI)

( * ) Notice: Subject to any disclaimer, the term of this patent is extended or adjusted under 35 U.S.C. 154(b) by 0 days.

(21) Appl. No.: 12/232,808

(22) Filed: Sep. 24, 2008

(65) Prior Publication Data

US 2009/0091877 A1    Apr. 9, 2009

(30) Foreign Application Priority Data

Oct. 8, 2007  (FI) .................................. 20075712

(51) Int. Cl.
*H02B 1/26* (2006.01)
*H05K 7/20* (2006.01)

(52) U.S. Cl. ........................ 361/622; 361/676; 361/690; 361/744

(58) Field of Classification Search ................. 361/676, 361/690, 622
See application file for complete search history.

(56) References Cited

U.S. PATENT DOCUMENTS

| | | | | |
|---|---|---|---|---|
| 4,520,425 A | * | 5/1985 | Ito ............................. | 361/697 |
| 4,528,614 A | * | 7/1985 | Shariff et al. .............. | 361/678 |
| 5,335,144 A | * | 8/1994 | Maroushek ................. | 361/695 |
| 5,398,159 A | * | 3/1995 | Andersson et al. ......... | 361/695 |
| 5,481,429 A | * | 1/1996 | Eriksson et al. ............ | 361/678 |
| 5,598,328 A | | 1/1997 | Dore | |
| 6,151,210 A | * | 11/2000 | Cercioglu et al. .......... | 361/690 |
| 6,504,714 B1 | * | 1/2003 | Richter ....................... | 361/695 |
| 6,643,123 B2 | * | 11/2003 | Hartel et al. ................ | 361/678 |
| 6,675,302 B2 | * | 1/2004 | Ykema ....................... | 713/300 |
| 7,061,759 B2 | * | 6/2006 | Karppinen et al. ......... | 361/695 |
| 7,126,820 B2 | * | 10/2006 | Wei ............................ | 361/695 |
| 7,140,702 B2 | * | 11/2006 | Byron et al. ................ | 312/296 |
| 2005/0189889 A1 | | 9/2005 | Wirtz et al. | |
| 2006/0171115 A1 | | 8/2006 | Cramer | |
| 2007/0147637 A1 | | 6/2007 | Pesonen | |

FOREIGN PATENT DOCUMENTS

FI            20051307        6/2007
WO    WO 2008/028205 A1    3/2008

OTHER PUBLICATIONS

Abb et al. "ABB Industrial Drives", ACS 800, single drive -taajuusmuuttajat, 0,55/2800 kW, tuoteluettelo, May 24, 2006, sivut Technical catalogue pp. 5, 6, 11, 14, 16, 18, 31, 34, 38.

* cited by examiner

*Primary Examiner*—Gregory D Thompson
(74) *Attorney, Agent, or Firm*—Birch, Stewart, Kolasch & Birch, LLP

(57) ABSTRACT

An enclosure arrangement, with protection against touch, of a power electronics appliance, more particularly of a frequency converter (31, 51) and its additional devices (12, 13), which solution contains an enclosed power electronics appliance and one or more enclosed additional devices installed in connection with it, which enclosed power electronics appliance and additional devices are modules, which can be fitted to be installed in combination one above the other such that the protection against touch of the appliance entity formed is as great as or higher than the protection against touch of the separate appliances.

20 Claims, 3 Drawing Sheets

ENCLOSURE OF A POWER ELECTRONICS APPLIANCE

FIELD OF TECHNOLOGY

Figure 1:
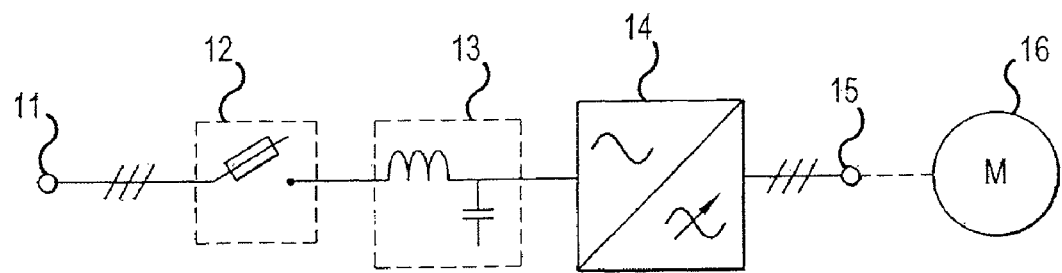

The present invention claims the priority benefit of Finnish Patent Application No. 20075712, filed in Finland on Oct. 8, 2007, which is hereby incorporated by reference for all purposes as if fully set forth herein.

The object of this invention is an enclosure arrangement of a power electronics appliance. More particularly the object of the invention is a mechanical structural solution of an enclosed power electronics appliance, particularly of a frequency converter, provided with separate additional devices according to the case, with which an enclosure arrangement protected against touch required by the installation in question is achieved.

PRIOR ART

Numerous additional devices that can differ according to the case are often incorporated into the same installation entity with a power electronics appliance, such as a frequency converter. Between the supply network and the appliance e.g. a fuse package for protecting against short-circuit and overload, a contactor or disconnector for isolation from the mains supply, a filter for attenuating interference caused to the supply network, etc., can be connected.

To ensure the safety of the user, the hazardous parts of appliances connected to an electricity network must be protected from accidental touch at least in accordance with class IP2X of standard IEC60529. The normal method of ensuring protection is to install appliances in an electrical cubicle or electrical enclosure. These types of cubicles and also large-sized enclosures are normally manufactured from conductive metal and they are earthed, in which case when the openable doors and hatches are closed, such as they should be in an operating situation, the user cannot accidentally access hazardous electrical parts.

The sizes of commercial cubicles and enclosures are standardized in accordance with international classifications, which facilitates their selection and availability and also reduces costs. In some cases it is possible also to select standard cubicles of the same height for reasons of appearance, e.g. when a number of cubicles must be placed in the same line side by side.

In certain situations problems arise from standard dimensioning. For example when a cubicle or enclosure is already full, a whole new cubicle or enclosure must be reserved for a single additional component, the content of which can in that case remain very incomplete. Incomplete filling means extra costs and surplus space requirement. It is also possible that a component disposed inside a cubicle is protected such as it is from accidental touch, in which case when it is disposed inside the cubicle the whole assembly contains numerous internal protections of which a part are technically superfluous and thus cause extra costs.

According to the requirements of modern serial manufacturing, placement into the cubicle or into the enclosure is normally performed in factory conditions, in which case pre-installed cubicle entities assemblies are transported to the usage site. This can produce transport problems in awkward installation conditions, e.g. in cranes or windmills in which the appliances can be placed at a height of tens of meters. In these kinds of circumstances also a servicing situation, e.g. replacement of a damaged device, can cause big problems. Neither can additional devices, the need for which can sometimes become apparent only at the installation site, be very flexibly installed into the system.

SUMMARY OF THE INVENTION

The purpose of this invention is to achieve a new kind of enclosure arrangement of power electronics appliances, such as of a frequency converter, with which the problems of prior art are avoided. The own enclosure class of the appliances of the system according to the invention is adequate from the viewpoint of the safety of the user, either such as they are or with detachable cover plates that give additional protection. The mechanical interfaces of the appliances of the system are additionally designed so that they can be installed as independent modules one above the other in the vertical direction such that the protection class of the entity formed is at least the same or even higher than the protection class of the parts of the system.

The cooling of the power components of power electronics appliances, such as of frequency converters, is most usually based on air circulation that is forced with a fan. In the system according to this invention the enclosure of the appliances comprises an air duct disposed in the rear part, which continues unbroken through the whole group of appliances installed one above the other. In some cases dirty air can travel in the air duct, for which reason e.g. the part of the system containing the control electronics can be sealed according to IP54 in the direction of the air duct. It is also possible that there is a different degree of protection by enclosure in the different appliances of the system.

The appliances of the system according to the invention that are installed one above the other can in principle be disposed in an arbitrary sequence, but e.g. to facilitate cabling it is preferable to place them in a certain sequence. Optimization of the air circulation of the air duct also sets certain limiting factors, because the fan can be included only in the appliance that produces most power loss. The fan that circulates the cooling air in the system functions best as a suction agent, in which case it is natural to dispose that appliance of the system that contains the fan as the highest.

The appliances of the system according to the invention are thus, from the standpoint of the safety of the user, adequately protected such as they are, in which case installing them in a separate cubicle or enclosure is unnecessary. In this way the additional costs according to prior art caused from internal walls are avoided. The system need not be installed until it is at the installation site, which facilitates transport, especially in difficult conditions, such as in cranes and windmills. For the same reason also the replacement of a damaged appliance in a servicing situation is easier than in appliances installed in a cubicle according to conventional technology.

The characteristic features of the solution according to the invention are described in detail in the claims below.

By means of the invention the assembly, transportation and servicing of a power electronics appliance, such as of a frequency converter, can be easily arranged.

SHORT DESCRIPTION OF THE DRAWINGS

Figure 2:
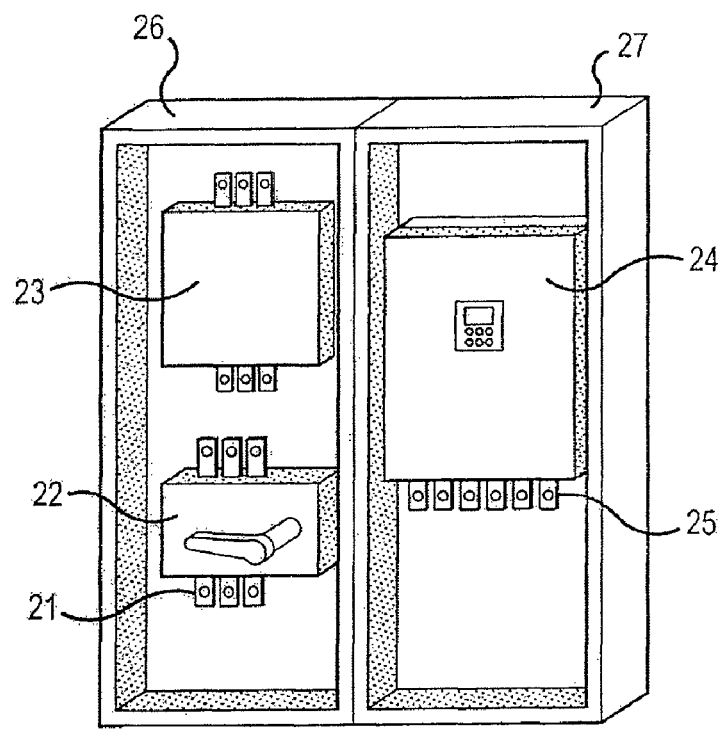
Figures 3A, 3B:
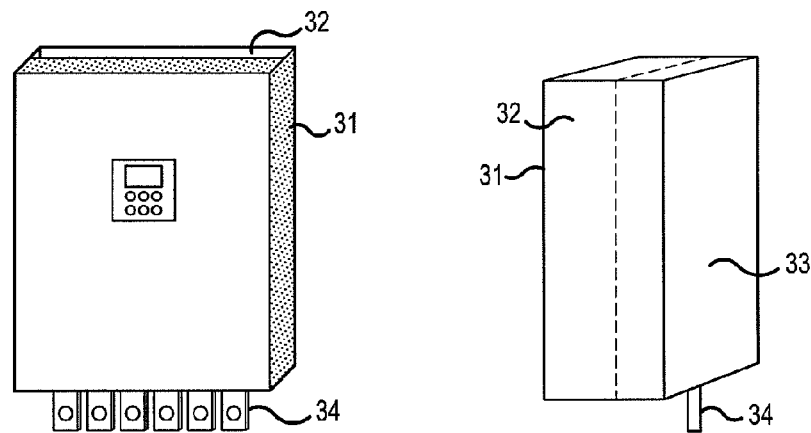
Figures 4A, 4B:
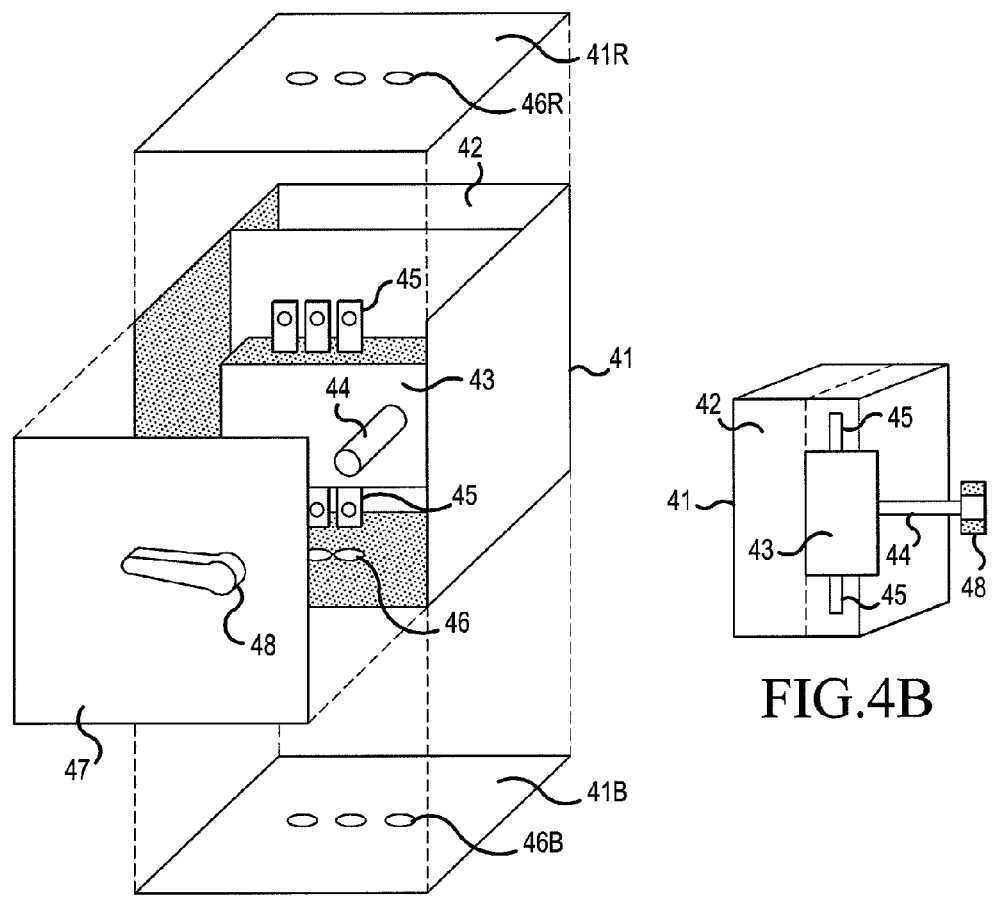
Figure 5A:
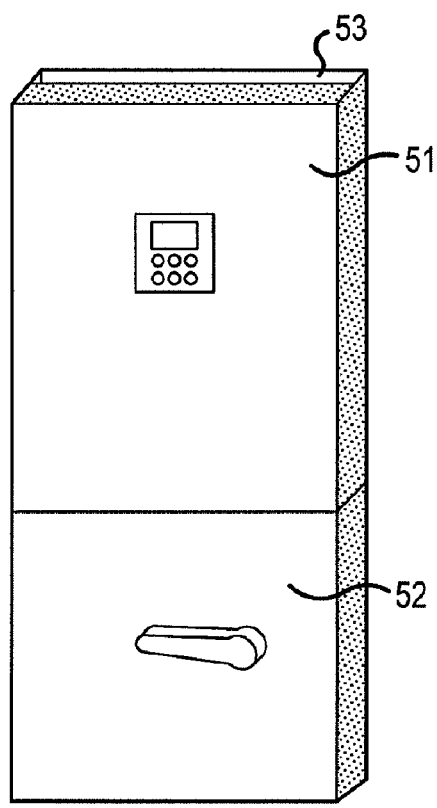
Figure 5B:
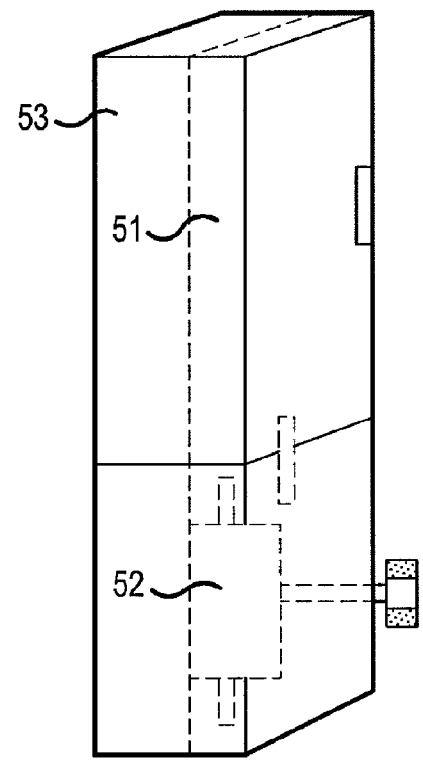

In the following, the invention will be described in more detail by the aid of an embodiment with reference to the attached drawings, wherein FIG. 1 presents a block diagram of a frequency converter system, FIG. 2 presents a conventional assembly of a power electronics appliance, FIGS. 3A and 3B presents the structure of a frequency converter, FIGS. 4A and 4B presents the structure of a fuse-disconnector module and FIGS. 5A and 5B presents the assembly of the system according to the invention.

DETAILED DESCRIPTION OF THE INVENTION

FIG. 1 presents a block diagram of a frequency converter system as an example of a typical power electronics appliance. The appliance comprises a connection to a three-phase supply network 11, a fuse-disconnector 12, an EMC filter 13 to attenuate the interference caused by leading to the supply network, and also a frequency converter 14 with its output connections 15. In addition the entity comprises a motor 16 generally disposed separately to the appliance, the speed of rotation of which is regulated with the frequency converter.

FIG. 2 presents a typical prior-art installation method in connection with the system according to FIG. 1. In the installation the appliances are disposed in two cubicles 26 and 27, of which the fuse-disconnector 22 with its network connections 21 and also the filter unit 23 are placed in one. The frequency converter 24 with its output connections 25 is disposed in the other cubicle. In an operating situation the doors (not shown in the figure) of the cubicles are closed, in which case they form a safe protector from touch covering the entity, as a result of which e.g. the cabling/busbars (not shown in the figure) between the parts of the system do not necessarily need to be separately protected.

FIGS. 3A and 3B present the structural principle of the frequency converter module 31 more closely, which can be similar to the unit 24 presented in FIG. 2. In the figure the module is presented both from the front (the left-hand side of the drawing) and from the side (the right-hand side of the drawing). Normally this kind of module is protected at least according to protection class IP20, in which case it can be installed as an independent unit e.g. on the wall. As a part of a conventional system it is often disposed in a cubicle, as presented in FIG. 2.

The frequency converter module that is the appliance according to this invention is constructed such that the cooling air duct 32 is disposed in the rear part of the appliance and the front part 33 of the appliance, where the connections of the power components and the control electronics are situated, is insulated from the air duct e.g. according to protection class IP54. The module also comprises a fan (not shown in the figure), which produces a forced circulation of air in the air duct. The power connections 34 are disposed in the bottom part of the appliance and they can be protected from accidental touch with an additional part when the module is disposed as an independent unit on the wall. When the second module of the system according to the invention is disposed under the module, protection from touching the output connections is not needed. Owing to the placement of the power connections, the frequency converter module is most naturally positioned as the topmost unit of the system according to the invention.

FIGS. 4A and 5B present an isometric front view and an isometric side view of another module of the structural system according to the invention, which contains a fuse-disconnector 43 and its connections 45. The disconnector is disposed in the touch-protected structure 41, the rear part of which contains free space 42 that passes through the module, which functions as a part of the air duct of the system. The control shaft 44 of the disconnector comes through the front panel 47 so that the handle 48 protrudes. The base plate 41B of the module contains holes 46B for enabling external cabling (as well as an interface to the supply network and an output interface leading through the module). A roof plate provided with cabling holes 46R can cover the top part of the module when the module is an independent unit. When part of a system of parts installed one above the other, the roof plate 41R or the base plate 41B or both can be omitted.

FIGS. 5A and 5B present an example of the assembly of the structural system according to this invention. The assembly in this case comprises a frequency converter module 51 and a fuse-disconnector module 52. The modules are installed one above the other such that the frequency converter module is the highest. The cooling air duct 53 continues through both modules, enabling efficient cooling. The point of the seam of the modules is close-fitting, in which case the entity is fully protected against touch.

It is obvious to the person skilled in the art that the different embodiments of the invention are not limited solely to the example described above, but that they may be varied within the scope of the claims presented below.

The invention claimed is:

1. An enclosure arrangement, comprising:
an enclosed power electronics appliance; and
enclosed additional devices which are connected to the power electronics appliance, the additional devices being different from the power electronics appliance,
the arrangement providing protection against touch of the power electronics appliance and the additional devices,
wherein the enclosed power electronics appliance and the enclosed additional devices are modules, which are adapted to be installed in combination one above the other to form a self-enclosed appliance assembly in which the power electronics appliance module and the additional devices module directly contact and mechanically interface with each other,
wherein the protection against touch of the power electronics appliance and the additional devices of the self-enclosed appliance assembly is as great as or higher than the protection against touch of the power electronics appliance and the additional devices as in a situation when the power electronics appliance and the additional devices are arranged separately from each other and do not directly contact and mechanically interface with each other.

2. The arrangement according to claim 1, wherein the power electronics appliance and the additional devices are installed in combination one above the other in a desired sequence to form the self-enclosed appliance assembly.

3. The arrangement according to claim 1, wherein a protection class of the self-enclosed appliance assembly is at least IP2X.

4. The arrangement according to claim 1, wherein a rear part of the self-enclosed appliance assembly is provided with a vertical space extending from top to bottom of the self-enclosed appliance assembly, from which an unbroken cooling air duct is formed.

5. The arrangement according to claim 1, wherein the power electronics appliance is a frequency converter and a cooling air duct is provided rearwardly of the power electronics appliance and the additional devices of the self-enclosed appliance assembly, and
wherein connections of the power electronics appliance and the additional devices of the self-enclosed appliance assembly are insulated from the air duct according to protection class IP54.

6. The arrangement according to claim 1, wherein an enclosure class of the self-enclosed appliance assembly is set based on characteristics of the power electronics appliance forming part of the self-enclosed appliance assembly, so that when a different power electronics appliance having different characteristics forms part of the self-enclosed appliance assembly, the self-enclosed appliance assembly has a different enclosure class.

7. The arrangement according to claim 1,
wherein the self-enclosed appliance assembly is exposed and not enclosed in another enclosure.

8. The arrangement according to claim 1,
wherein when the additional devices module is disposed below the power electronics appliance module, separate protection against touching connections of the power electronics appliance module is not needed.

9. The arrangement according to claim 2
wherein when the power electronics appliance and the additional devices are installed in combination one above the other, a protection class of the of the self-enclosed appliance assembly is at least IP2X.

10. The arrangement according to claim 2,
wherein a rear part of the self-enclosed appliance assembly is provided with a space extending from top to bottom of the power electronics appliance and the additional devices installed in combination one above the other, from which an unbroken cooling air duct is formed.

11. The arrangement according to claim 1,
wherein the power electronics appliance and the additional devices are configured so that when the power electronics appliance and the additional devices are installed one above the other, a mechanical interface between the power electronics appliance and the additional devices forms a seam having a close fit, and the self-enclosed appliance assembly is fully protected against touch.

12. The arrangement according to claim 2,
wherein the power electronics appliance is a frequency converter, and a cooling air duct is provided at a rear of the power electronics appliance and
wherein connections of the power electronics appliance and the additional devices of the self-enclosed appliance assembly are insulated from the air duct according to protection class IP54.

13. The arrangement according to claim 3,
wherein the power electronics appliance is a frequency converter, and a cooling air duct is provided at a rear of the power electronics appliance and
wherein connections of the power electronics appliance and the additional devices of the self-enclosed appliance assembly are insulated from the air duct according to protection class IP54.

14. The arrangement according to claim 4,
wherein the power electronics appliance is a frequency converter, and a cooling air duct is provided at a rear of the power electronics appliance and
wherein connections of the power electronics appliance and the additional devices of the self-enclosed appliance assembly are insulated from the air duct according to protection class IP54.

15. The arrangement according to claim 2,
wherein an enclosure class of the self-enclosed appliance assembly is set based on characteristics of the power electronics appliance forming part of the self-enclosed appliance assembly, so that when a different power electronics appliance having different characteristics forms part of the self-enclosed appliance assembly, the self-enclosed appliance assembly has a different enclosure class.

16. The arrangement according to claim 3,
wherein an enclosure class of the self-enclosed appliance assembly is set based on characteristics of the power electronics appliance forming part of the self-enclosed appliance assembly, so that when a different power electronics appliance having different characteristics forms part of the self-enclosed appliance assembly, the self-enclosed appliance assembly has a different enclosure class.

17. The arrangement according to claim 4,
wherein an enclosure class of the self-enclosed appliance assembly is set based on characteristics of the power electronics appliance forming part of the self-enclosed appliance assembly, so that when a different power electronics appliance having different characteristics forms part of the self-enclosed appliance assembly, the self-enclosed appliance assembly has a different enclosure class.

18. The arrangement according to claim 1,
wherein when the additional devices are installed independently of the power electronics appliance, a roof plate and base plate is provided to the additional devices in order provide a touch-protected structure, and
when the power electronics appliance and the additional devices are installed one above the other to form the self-enclosed appliance assembly, one or both of the roof plate and the base plate are omitted.

19. The arrangement according to claim 2,
wherein connections of the power electronics appliance are disposed at a bottom part of the power electronics appliance so that the connections are protected from accidental touch when the module of the power electronics appliance is disposed as an independent unit, or at a lowest part of the self-enclosed appliance assembly.

20. The arrangement according to claim 3,
wherein connections of the power electronics appliance are disposed at a bottom part of the power electronics appliance so that the connections are protected from accidental touch when the module of the power electronics appliance is disposed as an independent unit or at a lowest part of the self-enclosed appliance assembly.

* * * * *